US006473881B1

(12) United States Patent
Lehner et al.

(10) Patent No.: US 6,473,881 B1
(45) Date of Patent: Oct. 29, 2002

(54) PATTERN-MATCHING FOR TRANSISTOR LEVEL NETLISTS

(75) Inventors: Valerie D. Lehner, Hopewell Junction, NY (US); John M. Cohn, Richmond, VT (US); Ulrich A. Finkler, Montrose, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 09/702,313

(22) Filed: Oct. 31, 2000

(51) Int. Cl.$^7$ .............................................. G06F 17/50
(52) U.S. Cl. ....................... 716/2; 716/3; 716/5; 716/7; 716/18; 703/14
(58) Field of Search ..................... 716/1–21; 703/14–16

(56) References Cited

U.S. PATENT DOCUMENTS

| | | | | |
|---|---|---|---|---|
| 5,031,111 A | * | 7/1991 | Chao .............................. | 716/7 |
| 5,696,693 A | * | 12/1997 | Aubel et al. ..................... | 716/8 |
| 5,841,674 A | * | 11/1998 | Johannsen ..................... | 716/12 |
| 5,898,595 A | * | 4/1999 | Bair ................................. | 716/2 |
| 5,974,242 A | * | 10/1999 | Damarla et al. ................. | 716/2 |
| 6,026,222 A | * | 2/2000 | Gupta et al. .................... | 716/5 |
| 6,088,523 A | * | 7/2000 | Nabors et al. ................. | 703/14 |
| 6,195,788 B1 | * | 2/2001 | Leaver et al. ................. | 716/18 |
| 6,243,850 B1 | * | 6/2001 | Shibuya .......................... | 716/8 |
| 6,308,299 B1 | * | 10/2001 | Burch et al. .................... | 716/4 |
| 6,336,206 B1 | * | 1/2002 | Lockyear ...................... | 716/7 |

OTHER PUBLICATIONS

Kim et al., "Hierarchical LVS based on hierarchy rebuilding", Proceedings of the Asia and South Pacific Design Automation Conference, Feb. 10, 1998, pp. 379–384.*

Kunz et al., "Logic Optimization and Equivalence Checking by Implication Analysis", IEEE Transactions on Computer–Aided Design of Integrated Circuits and Systems, vol. 16, No. 3, Mar. 1997, pp. 266–281.*

Chatzigeorgiou et al., "A Modeling Technique for CMOS Gates", IEEE Transactions on Computer–Aided Design of Integrated Circuits and Systems, vol. 18, No. 5, May 1999, pp. 557–575.*

Rao et al., "On clustering for maximal regularity extraction", IEEE Transactions on Computer–Aided Design of Integrated Circuits and Systems, vol. 12, No. 8, Aug. 1993, pp. 1198–1208.*

* cited by examiner

Primary Examiner—Matthew Smith
Assistant Examiner—Phallaka Kik
(74) Attorney, Agent, or Firm—H. Daniel Schnurmann

(57) ABSTRACT

A single pattern-matching algorithm which allows both exact and inexact pattern-matching so that transistor-level design automation tools can reliably perform timing analysis, electrical rules checking, noise analysis, test pattern generation, formal design verification, and the like prior to manufacturing custom logic. The user (circuit designer) specifies which of each of the pattern external nets may be matched inexactly (attached to Vdd, attached to GND, and shorted to other external nets), with the remainder of the pattern external net connections being matched using exact isomorphism constraints. The method described herein achieves a substantial reduction in the number of patterns which circuit designers must generate, and altogether eliminates the need for an exponential number of patterns by providing an inexact pattern matcher to circuit designers. It further provides rooted sub-graph isomorphism so that a user can query whether a particular pattern is embedded at a particular location in the main circuit design, utilizing inexact sub-graph isomorphism

17 Claims, 4 Drawing Sheets

PATTERN-MATCHING FOR TRANSISTOR LEVEL NETLISTS

FIELD OF THE INVENTION

This invention is related generally to the design of integrated circuit chips and, more particularly, to a method of matching sub-circuit patterns in a larger transistor-level circuit design for the purpose of timing analysis, electrical rules checking, noise analysis, test pattern generation, design verification and circuit optimization.

BACKGROUND OF THE INVENTION

VLSI (Very Large Scale Integration) and ULSI (Ultra Large Scale Integration) chips involve a heavy commitment of computer resources to design, test and manufacture chips and systems that involve millions of circuits interconnected to each other. Because of the large number of transistors, it is no longer possible to perform this task manually. As a result, a new field referred to as Electronic Design Automation (EDA) has been developed over the last decades to address the complexity of this design process.

Much of the increase in the size of modern VLSI has been accomplished through levels of abstraction and reuse. Large designs commonly consist of pre designed logic functions called "cells". These cells are provided in a library complete with characterizations of their function, timing performance, layout characteristics etc. While this greatly facilitates ease of reuse, the dependence on pre characterization tends to come at a cost. The necessity of limiting the number of cells provided in a library to a manageable number limits the flexibility that a designer has with regard to circuit topologies, device sizes and layout choices. This generally manifests itself in a reduction in chip performance and density. For this reason, large portions of those designs most sensitive to performance and/or density considerations are still implemented at a lower level of abstraction. So-called custom logic is designed at the transistor rather than the cell-level which affords the designer much greater flexibility to tune the design to his/her application. In addition to being more labor intensive, this custom design style places an additional burden on the design tools.

Unlike a high-level abstraction, transistor-level designs require tools to infer functionality from connectivity. All circuit design analysis and verification tools require identification of sub-circuits from a flat (nonhierarchical) netlist. The task of EDA tools is compounded by a large number of circuit combinations and a need to understand many custom design styles. This need to identify sub-circuits from a sea of transistors motivates an invention for pattern matching which can identify groups of transistors for any transistor-level EDA tool.

Sub-Graph Isomorphism

Isomorphism is defined as having the "same form" or "same shape". If two groups of elements are isomorphic, there is a one-to-one relationship between the elements of one group and the elements of another. Graph isomorphism signifies that two entire graphs are identical. Sub-graph isomorphism implies that there is a one-to-one relationship between each element of the sub-graph and one of the elements of the larger graph.

Sub-graph isomorphism is a technique that is used advantageously for pattern matching. Pattern matching in a transistor-level netlist implies that every instance of a pattern, consisting of a plurality of transistors, can be found in a larger transistor-level netlist. The pattern is represented as a sub-graph, while the larger transistor-level netlist is modeled as a graph. In the field of circuit design analysis and verification, sub-graph isomorphism implies that all the transistors and electrical net connections which are present in the sub-graph can be found in a larger circuit graph. Typically, a circuit designer attempts to localize specific sub-circuits, such as an inverter or a multiplexer, in a larger circuit design. These sub-circuits need to be found such that the VLSI or ULSI design can be correctly timed, analyzed for circuit noise, checked for compliance with electrical rules specifications, tested, and formally verified. This identification of sub-circuits in a larger transistor-level circuit design is sometimes referred to sub-circuit extraction.

By way of example of how the problem of pattern matching has been handled heretofore, there is shown in FIG. 1 an inverter pattern 102 integral to a larger circuit design 104. There is one instance of the pattern in the larger circuit design. The match can be seen as follows:

| Pattern: | | Larger circuit design: |
|---|---|---|
| input | matches | inp |
| output | matches | mid |
| P1 | matches | MPinv |
| N1 | matches | MNinv |
| Vdd | matches | Vdd |
| GND | matches | GND |

In an exact pattern-matching, a pattern instance in the circuit design can only be identified as such if it precisely matches the specification of the pattern. The pattern instance will be missed by the pattern matcher if inputs are attached to Vdd or GND, or if inputs are shorted together. If any modification exists, the instance will not be recognized by the pattern matcher. Inexact pattern matching, on the other hand, implies that the instance can be recognized even if certain modifications are made in the imbedding of the pattern in the larger transistor-level netlist. Common modifications made by circuit designers include attaching inputs to Vdd or GND and shorting together of inputs. Only an inexact pattern matcher is able to identify such pattern instantiations.

In an inexact pattern-matching, the constraints for isomorphism are relaxed at the pattern external (boundary) net connections such that external nets in the pattern instance can be connected to special nets, such as Vdd or GND, or shorted to other external nets. Inexact sub-graph isomorphism is critical in transistor pattern-matching because, heretofore, users were required to specify a potentially exponential number of exact patterns in order to find all possible combinations of external connectivity.

The difficulties encountered by circuit designers who employ a prior art pattern matcher will be better understood with reference to the 3-input multiplexers illustrated in FIG. 2. Therein are shown fourteen patterns that are typically required to enumerate all possible combinations of external net connectivity of the 3-input multiplexer. The fourteen patterns capture all possible combinations of inputs attached to Vdd, to GND, and shorted together. Practitioners in the art will readily realize that, in the prior art, the number of patterns required grows exponentially with the number of inputs.

An effective way of avoiding the enumeration of exact patterns has not been identified up to now. Thus, circuit designers spend countless hours enumerating patterns and manually ensuring that they identified all external net configurations that are present in their design. Circuit designers called a pattern matcher for each of the thirteen possible modified patterns in order to find all instances of the general pattern referenced by FIG. 2 numeral 1 in their circuit design. Missed pattern instances due to a failure to identify all of the external net configurations lead to transistor-level timing errors, design verification errors, errors in circuit test pattern generation, and errors in electrical rules checking, resulting in a significant loss of functionality and slowing down many of the steps required to bring a circuit design to market.

Graph isomorphism techniques have been used for transistor-level netlist comparison in the past. Corneil's graph labeling algorithm, described in "Recent Results on the Graph Isomorphism Problem", Proc. Eighth Manitoba Conference on Numerical Mathematics and Computing, 1978, pp.13–31, is well-known and is the initial work on graph labeling using matched neighbors. Applications of Corneil's graph isomorphism algorithm and graph coloring for graph isomorphism are described in U.S. Pat. No. 6,009,252 to Lipton entitled "Methods, apparatus, and computer program products for determining equivalencies between integrated circuit schematics and layouts using color symmetrizing matrices" and in U.S. Pat. No. 5,463,561 to Razdan entitled "High Capacity Netlist Comparison". The aforementioned patents solve the graph isomorphism problem for two netlists. They do not solve the sub-graph isomorphism problem or the inexact sub-graph isomorphism problem.

M. Ohlrich, C. Ebeling, et. al. at the University of Washington, in an article entitled "SubGemini: Identifying SubCircuits using a Fast Subgraph Isomorphism Algorithm", 30th ACM/IEEE Design Automation Conference, 1993 IEEE, pp. 31–37, describe a solution to the exact sub-graph isomorphism problem for transistor-level netlists. It is a sub-circuit extraction technique entitled SubGemini which is an extension of Corneil's graph isomorphism algorithm. The pattern and the main circuit design (master graph) are labeled alternately (rather than via explicit net comparison as will be described hereinafter in the detailed description of the invention). Labels are based on matched neighbors. Thus, if two nets or two devices have the same label, then a match is possible. It is not possible to extend the algorithm to compare labels for anything other than equality, and neither is there a method for matching two pattern nets to one master net, as is the case when the inputs are shorted together. Further, it is not possible for a pattern net to be matched to a master Vdd or GND net, since these must be provided with special labels in order to be identified as Vdd or GND. Therefore, SubGemini can perform only exact sub-graph pattern matching, requiring the user to enumerate all possible external net pattern variations, as shown in FIG. 2. In summary, SubGemini does not solve the inexact sub-graph isomorphism problem.

In U.S. Pat. No. 5,625,564 to Rogoyski entitled "System and method for hierarchical device extraction" devices are extracted from hierarchical shapes data. It uses rules instead of patterns. Its intent is to obtain devices from shapes and not sub-circuits from devices. Thus, it is not a general pattern matcher and does not perform inexact sub-graph isomorphism.

Z. Ling and D. Yun, in an article entitled "An Efficient Sub-Circuit Extraction Algorithm by Resource Management", published in the Proceedings of Second International Conference on ASIC, Shanghai, P. R. China, 21–24 October 1996, describe an initial but fundamentally flawed solution for addressing the inexact sub-graph isomorphism problem. Referred to as the Generic Edge Unit-based Matching Algorithm, the technique defines isomorphism as any superset of the connectivity in the pattern. The worst-case time complexity, certainly imaginable when one considers the number of device connections which special nets such as Vdd and GND typically have, contains a factor $d^{2n}$, wherein d is the maximal node degree in the main graph and n is the number of devices on the net in the sub-graph. This time complexity is caused by the pair-wise device adjacency edges which are used in place of hypergraph net nodes. The definition of isomorphism as any superset of the connectivity in the pattern is not a useful definition of isomorphism in transistor topologies because the user cannot constrain the number of transistors on internal nets, leading to false-positive matches. The algorithm cannot be extended to allow constraints on net connectivity because there is no explicit net node connectivity to be specified via pair-wise device adjacency edges. Ruling out these false matches is of exponential complexity and is not of practical use.

Based on an extensive search, no practical solution to the transistor-level inexact sub-graph isomorphism problem has, thus far, been found.

OBJECTS OF THE INVENTION

Accordingly, it is a primary object of the invention to provide a single pattern-matching algorithm which allows both exact and inexact pattern-matching so that transistor-level design automation tools can reliably perform transistor-level timing analysis, electrical rules checking, noise analysis, test pattern generation, design verification, and the like prior to manufacturing custom logic.

It is another object of the invention to allow a user (circuit designer) to specify which of each of the pattern external nets may be matched inexactly (attached to Vdd, attached to GND, or shorted to other external nets), and having the remainder of the pattern external net connections matched using exact isomorphism constraints.

It is still another object of the invention to achieve a substantial reduction in the number of patterns which circuit designers must generate, and altogether eliminate the need for an exponential number of patterns, by providing an inexact pattern matcher to a circuit designer.

It is yet another object of the invention to eliminate missed pattern instances in a circuit design, where the pattern is embedded such that its input(s) are attached to Vdd, attached to GND, or shorted to other inputs.

It is a further object of the invention to provide rooted sub-graph isomorphism so that a user can query whether a particular pattern is embedded at a particular location in the main circuit design, utilizing inexact sub-graph isomorphism.

SUMMARY OF THE INVENTION

The present invention solves both the exact and inexact sub-graph isomorphism problems for transistor-level netlists. Heretofore, only the exact pattern-matching problem has been solved efficiently. The goal in the invention is to quickly and efficiently identify sub-circuits from transistor-level designs via inexact sub-graph isomorphism.

The invention uses explicit net comparison to identify symmetry classes of nets which are potential matches. The members of each symmetry class are iterated over, using recursive calls to match the remainder of the pattern, and using backtracking to undo incorrect matches while exploring the entire solution space. Heuristics allow recursive calls in an optimal order to prevent an inherent worst-case exponential time for solving the sub-graph isomorphism problem.

According to the invention, a technique including a method of matching a pattern sub-circuit in a master circuit design is provided, the master circuit design being both formed by a plurality of master devices interconnected by master nets and modeled as a graph, and the pattern sub-circuit being formed by a plurality of pattern devices interconnected by pattern nets and modeled as a graph, wherein both nets and devices are explicitly modeled as nodes in the graphs, enabling both exact and inexact pattern matching using a single pattern matching engine, the method including the steps of: a) defining an explicit net comparison function that enables both the exact matching and the inexact matching of the pattern net to a master net, where an inexact match is a match to a master net which is connected to a power supply or to a net which is already matched to another pattern net; b) defining an explicit device comparison function that enables the exact matching of the pattern device to the master device based on a device characteristic; c) defining a node comparison function which compares two device nodes using the explicit device comparison function or compares two net nodes using the explicit net comparison function; d) identifying a pattern keynode; e) identifying a set of candidate nodes in the master circuit design for which a node comparison function is indicative of a potential match between the pattern keynode and a node in the master circuit design; f) iterating over the set of master candidate nodes; g) for each of the master candidate nodes exploring a potential match of the pattern in the master circuit design containing the candidate node, and h) repeating steps f) and g) until all instances of the pattern in the master circuit design have been identified.

Step g) further comprises the steps of: g1) matching the pattern node to the master node; g2) creating symmetry classes of device nodes and symmetry classes of net nodes connected to the nodes matched in step g1), where the symmetry class consists of a set of nodes comprising one pattern node and at least one master node which are potential matches; g3) identifying the symmetry classes which consist of exactly one pattern node and one master node and matching the pattern node to the master node for each of the identified symmetry classes; g4) using the node comparison function to identify the symmetry classes of nodes connected to the nodes matched in step g3); g5) repeating steps g3) and g4) until there are no symmetry classes which consist of exactly one unmatched pattern node and one master node; g6) selecting one symmetry class from all the symmetry classes which contain an unmatched pattern node; g7) iterating over the members of the symmetry class, exploring the potential match of the pattern node to each of the master nodes in the symmetry class: and g8) for each master node, making a recursive call with the initial match of the pattern node to the master node, and repeating steps g1) through g8) until either all pattern nodes have been matched to master nodes or a mismatch is found, prompting backtracking and unmatching nodes up to the symmetry class iteration in step g7).

Upon identification of each instance of the pattern, a user-supplied function is invoked to enable circuit design analysis, verification or optimization prior to its manufacture.

BRIEF DESCRIPTION OF THE DRAWINGS

The accompanying drawings, which are incorporated and which constitute part of the specification, illustrate presently a preferred embodiment of the invention and, together with the general description given above and the detailed description of the preferred embodiment given below, serve to explain the principles of the invention.

DESCRIPTION OF THE PREFERRED EMBODIMENT

The present invention will now be described more fully with reference to FIGS. 3 and 4. The present invention may, however, be embodied in many different forms and should not be construed as limited to the embodiments presented herein. This particular embodiment is that of a general-purpose transistor-level pattern matcher for locating sub-circuits in transistor-level timing, design verification, circuit test pattern generation, noise analysis, and electrical rules checking.

The transistor-level pattern matcher allows both exact and inexact sub-graph isomorphism in order to quickly and efficiently identify sub-circuits from transistor-level designs. As previously stated, in the case of an inexact pattern matching, the constraints for isomorphism are relaxed at the pattern external (boundary) net connections such that external nets in the pattern instance can be connected to special nets, such as Vdd or GND, or shorted to other external nets.

Figure 1A:
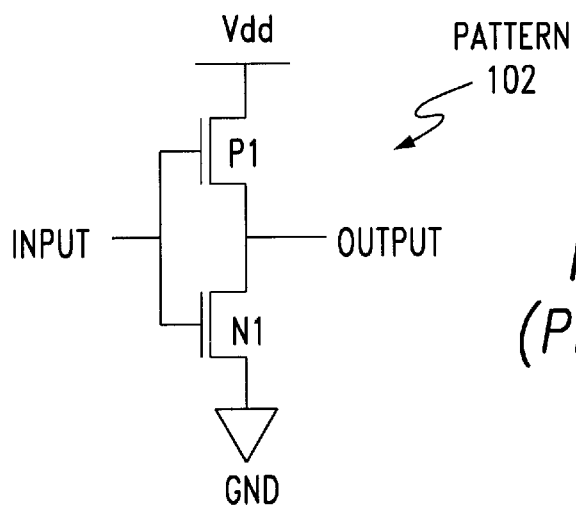
FIG. 1 provides a simple example of prior art transistor-level pattern matching, showing an inverter pattern and one instance of a pattern in a larger circuit design.
Figure 1B:
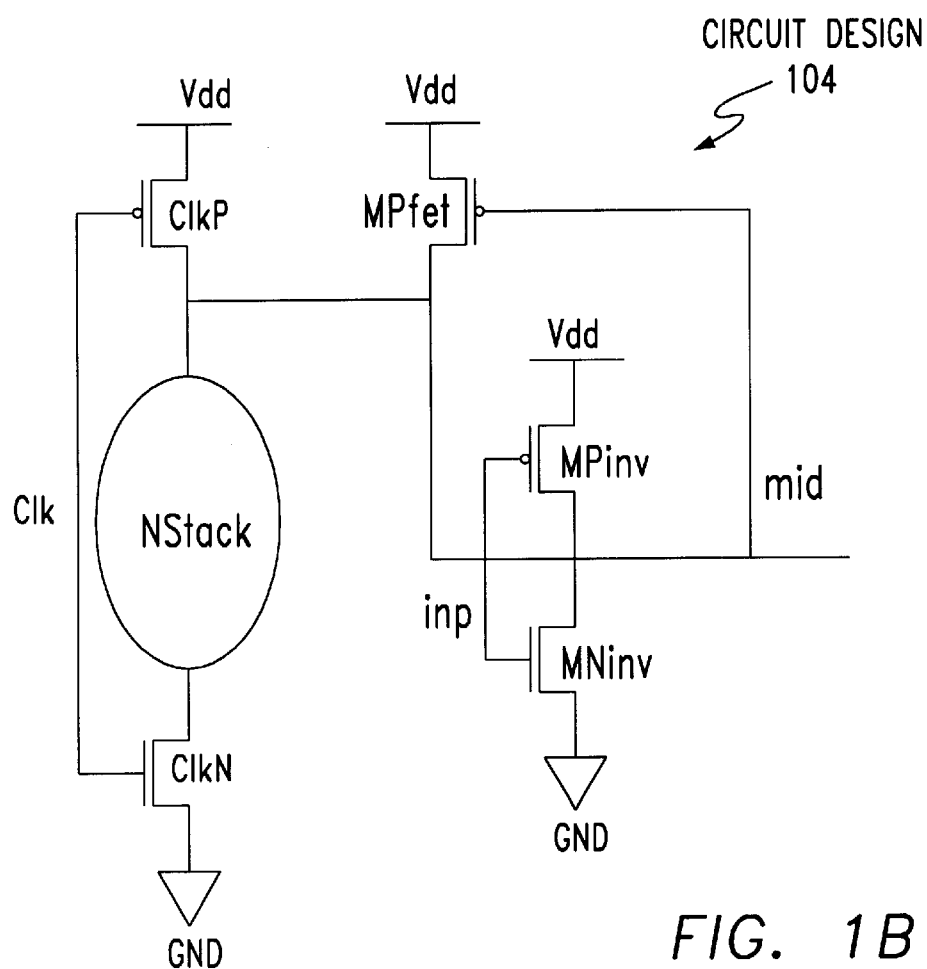
Figure 2:
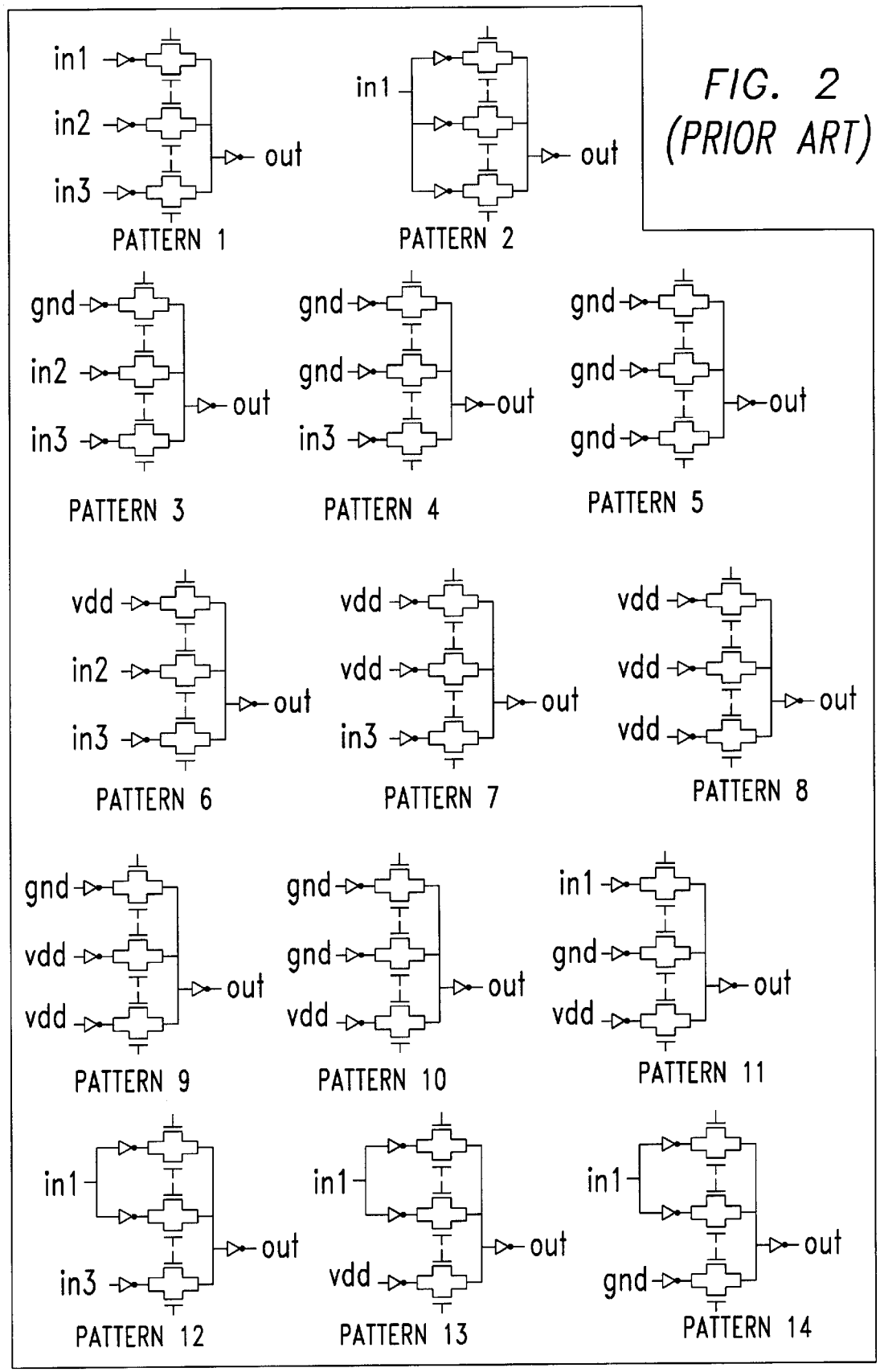
FIG. 2 illustrates an example of the exponential number of patterns required in the prior art, showing the general three-input multiplexer in pattern 1 and thirteen patterns that are typically required to enumerate all possible combinations of external net connectivity applicable to a three-input multiplexer.

Whereas a multiplexer has been selected as a sample circuit to illustrate a concept in the present invention, practitioners in the art will fully realize that similar conclusions may be reached for other circuits and logic. When inexact sub-graph isomorphism is available to the circuit designer, the single three-input multiplexer pattern shown in pattern 1 of FIG. 2 is sufficient to find all the occurrences of three-input multiplexers in the main circuit design. This single pattern is passed to the pattern matcher, eliminating the need for the remaining 13 patterns required by the prior art. The pattern matcher identifies all instances of three-input multiplexers in the main circuit design even if those instances have input nets attached to Vdd, to GND, or shorted to other input nets. Those input nets are matched using inexact sub-graph isomorphism to the nets of the pattern.

In order to better understand the invention and the implementation thereof, certain basic definitions must first be understood. Note that the definitions of a wildcard net and a symmetry class are unique to the present invention. The unique definition of a match in a sub-circuit pattern-matching context is critical for understanding inexact sub-graph isomorphism.

Definitions pattern: the sub-graph containing a topological description of the sub-circuit's devices and nets;

master: the main graph containing a topological description of the main circuit design;

instance: a valid match of the pattern in the master;

internal net: a net which has all device connections explicitly stated within the pattern;

external net: this type of net may be connected to devices outside the pattern instance;

wildcard net: an external net which may be attached to a power supply, such as Vdd or GND, or may be shorted to other wildcard nets;

proto pin: a hierarchical boundary net connection; and symmetry class: one pattern node (net or device) and a set of master nodes which could contain the pattern node's match.

Constraints

Figure 3:
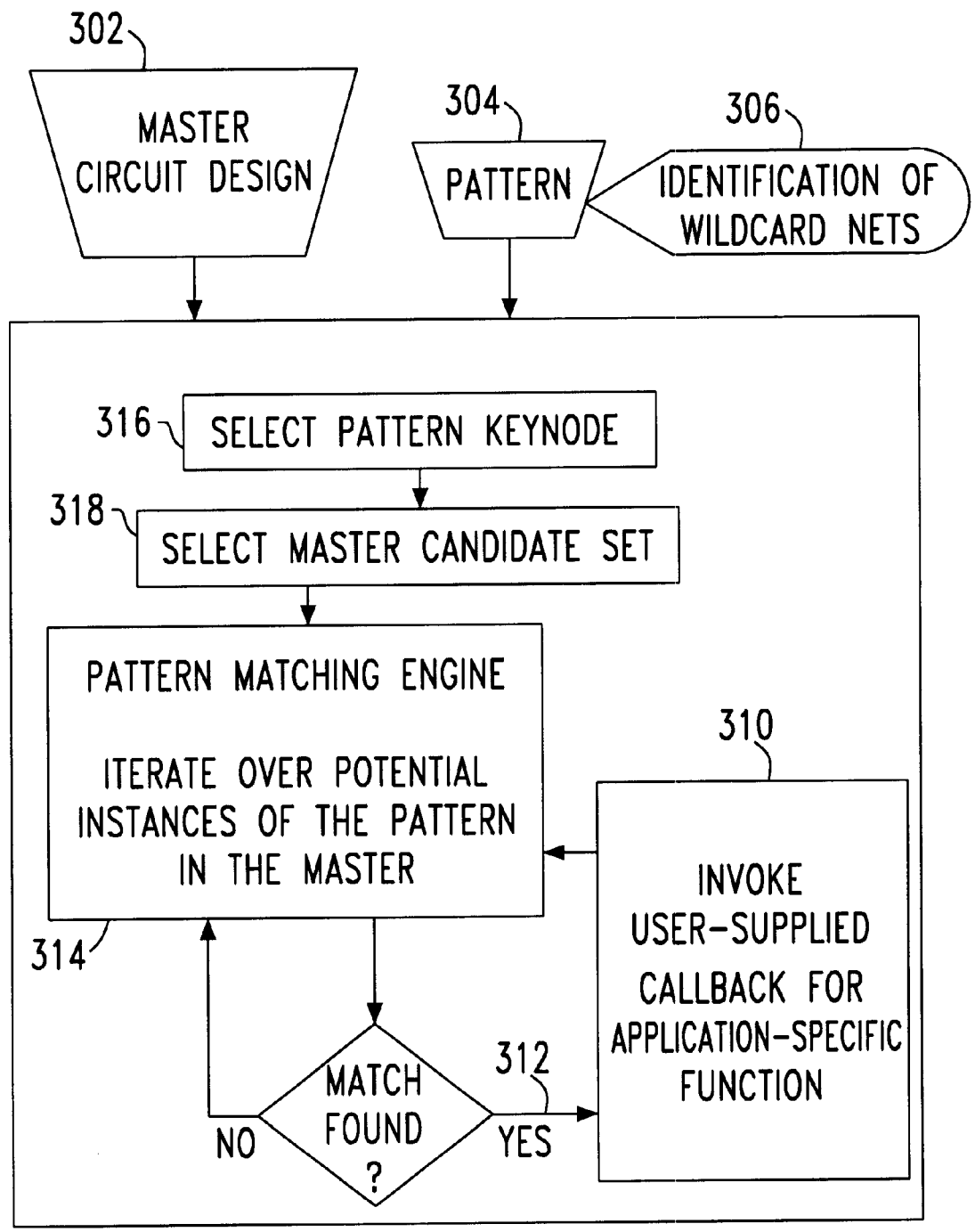
FIG. 3 shows a general-purpose transistor-level pattern matcher for locating sub-circuits in transistor-level circuit designs, for use in transistor-level timing, design verification, circuit test pattern generation, circuit noise analysis, and electrical rules checking, in accordance to the invention.

Following are the constraints which define a match:

a) pfet matches pfet;

b) nfet matches nfet;

c) gate net matches gate net;

d) source/drain are interchangeable;

e) internal pattern net matches master net of the same degree (number of each type of device connection);

f) external pattern net matches master net of >=degree;

g) Vdd/GND specified in the pattern must match Vdd/GND in the master;

h) all pattern connectivity must be present in the master;

i) wildcard pattern nets can match special nets, such as Vdd/GND, in the master; and j) wildcard pattern nets can be shorted to other wildcard nets in the master Referring now to FIG. 3, the pattern matcher is invoked, with the inputs consisting of a pattern sub-circuit 304 and a master transistor-level design 302. The pattern matching engine 314 finds all instances of the given pattern in the master. Key elements of the implementation include pattern (sub-graph) keynode selection 316, master (main circuit graph) candidate selection 318, identification of all instances of the pattern in the master using inexact sub-graph isomorphism 314, user's specification of wildcard nets 306, and rooted sub-graph isomorphism 408 (FIG. 4).

The pattern matching engine makes use of an explicit net comparison to identify symmetry classes of nets which are potential matches. The members of each symmetry class are iterated over, and recursive calls are used to match the remainder of the pattern. Backtracking is used upon discovery of a mismatch while exploring the entire solution space. Heuristics allow recursive calls in an optimal order to prevent the inherent worst-case exponential time for solving the sub-graph isomorphism problem. Previous exact sub-graph isomorphism solutions used matched-neighbor labeling functions which are not flexible enough to allow external nets to be attached to Vdd, attached to GND, or shorted to other external nets.

User's Interface

The user specifies external nets in the pattern by connecting them to proto pins or flagging them as external nets. Specifying wildcard nets 306 is achieved in one of two ways. Either the user provides a list of external net names which have greater flexibility for matching, or the all_ext_ nets keyword may be used to flag all external nets as wildcard nets. When each circuit is read, all Vdd nets are merged into one Vdd net, and all GND nets are merged into one GND net.

For each pattern, the user calls the pattern matcher FIG. 3, which finds each instance of the pattern 304 in the master 302 and returns the number of matches found. Each time a match is found 312, a user-supplied Tcl (scripting language) or C++ callback function 310 is automatically invoked. Using the device and net names from the pattern, the user accesses the matching master devices and nets to perform an application-specific function. All transistors and nets in the instance may also be printed.

After each match, the master transistors are automatically left flagged as 'matched' so that they are not reused to find other pattern instances. External nets are automatically unmatched so that they can be reused for other instances. If the user wishes that devices be available for future matches, the user can clear the matched flag on specific devices from within the callback function or clear all matches in the master at any time.

Net Comparison Function

The net comparison function takes in a pattern net and a master net and returns −1 if they cannot be matched to each other; 0 if they are already matched to each other; 1 if they could be an exact match; and the number of connections by which they differ +1 if they could be an external net or wildcard net match. The net comparison function uses the net degree (number of gate connections to n-type devices, number of gate connections to p-type devices, number of source/drain connections to n-type devices, number of source/drain connections to p-type devices), Vdd/GND flag, external net flag, matched flag, and wildcard net flag to determine if a particular pattern net can be matched to a particular master net.

The pattern matcher can be extended to other types of devices, e.g., bipolar and 4-terminal devices, with simple modifications to the net and device comparison functions. The same net and device comparison functions are used in pattern keynode selection, master candidate selection, and in the pattern matching engine itself.

Pattern (Sub-graph) Keynode Selection

A pattern keynode 316 is a starting point for the matching process. The keynode is selected such that it minimizes the number of potential instances of a pattern in the master which must be explored. A keynode may be an internal net or an external net, but is not chosen to be a device since the only comparison criterion among devices is n-type or p-type. If there exists a net in the pattern which has no potential matches in the master, there are no instances of the pattern in the master.

The technique for selecting a keynode is as follows:

for each pattern net
  for each master net
    call the net comparison function
  only examine the Vdd and GND nets if no other pattern net exists
  select the pattern net with the smallest number of potential matches as the keynode Master (Main Circuit Graph) Candidate Selection The set of master candidates 318 consists of all the nets for which the net comparison function indicates a potential match with the pattern keynode. Each master candidate represents a potential instance of the pattern in the master.

Inexact Sub-Graph Isomorphism

New algorithms used in this pattern matcher have been implemented to allow a comprehensive solution that includes both the inexact and the exact sub-graph isomorphism problems. For the inexact sub-graph isomorphism, the instance of the pattern in the master need not meet precisely the specifications in the pattern in order to be a correct match. The present invention provides user specification for which external nets are allowed to match Vdd/GND or to be shorted to other external nets. Nets with such flexibility are called wildcard nets (306). A matching partner pointer is maintained for every node (net or device) in the master and the pattern. This facilitates the matching process particularly for wildcard nets. In summary, inexact sub-graph isomorphism allows matching a wildcard pattern net to a master Vdd net, to a master GND net, or to a master net already matched to a pattern net as present with shorted nets.

The matching process begins by identifying a keynode in the pattern and a list of candidate nodes in the master. The pattern matching engine then loops over the candidate nodes, calling the recursive matching function for each potential instance of the pattern in the master. The initial recursive function call for each potential instance is made with the pattern keynode and the master candidate node matched to each other. The matching function examines the devices on these initially matched nets, classifying them according to the type of the device and the type of connection (gate or source/drain). Devices which could match each other are given the same label in order to identify them as a symmetry class. They are placed in a dynamically growing array of labeled devices and nets. The labels are used to group together a pattern node and one or more master nodes which are potential matches. The array is maintained and explored in label-order. If there is a pattern device which can be matched to a unique master device, these two graph nodes are selected and matched to each other. Their children, which are nets, are subsequently examined and placed into symmetry classes by using the net comparison function described above. This process of identifying uniquely matching graph elements from the labeling array continues until only symmetry classes remain.

If at any point a child of a matched node has no potential matching partner, the implication is that the initial match for that recursive level was incorrect and, therefore, all matches made in the current recursive call are mismatches and must be undone. The system then backtracks, 'unmatching' nodes at each level, until a level is reached where there is another member of a symmetry class which has not yet been explored. If at any point there are no unmatched pattern nodes or no remaining symmetry classes, the recursion stops and a valid instance of the pattern in the master has been found.

During the matching process, no recursive calls are made until all unique pattern/master pairs have been matched and their children have been placed into the labeling array. This is an important heuristic which helps to prevent the inherently exponential worst-case time complexity for solving the sub-graph isomorphism problem. When there are no more matches which do not involve symmetry classes, a recursive call is made.

In preparation for a recursive call, two items must be taken into consideration. First, the smallest symmetry class is selected. Selecting the smallest symmetry class is another important heuristic for preventing an exponential run-time. A symmetry class consists of one pattern node and a set of master nodes which may contain the pattern node's matching partner. One symmetry class is iterated over for each recursive level. Remaining symmetry classes are passed down to the next level, ensuring that all possible combinations are evaluated. Second, a new labeling array is created. The first elements placed in the array are the symmetry class elements which are being matched to each other to explore the next region of the solution space. Following these two unique elements, all remaining symmetry classes are copied into the labeling array. If the matching process continues to be successful, these symmetry classes will be handled at lower recursive levels. The advantage of creating a new array for each recursive level is that when a false path through the solution space is explored, it is easy to undo the net and device matches which were performed at each level while preserving matches which were performed at higher levels.

When a recursive call is made, matching proceeds exactly as in the first recursive level, beginning with the first pair of net or device nodes in the array, followed by their uniquely labeled children, until only symmetry classes remain, as described above.

Each time an instance of the pattern in the master is found, the user callback 310 is invoked and the valid match count is incremented. The user callback provides the application-specific action for each pattern instance, and is the ultimate purpose of pattern matching: to correctly perform circuit timing, design verification, test-pattern generation, circuit noise analysis, or electrical rules checking to ensure that circuit designs can be speedily brought to market.

Rooted Sub-Graph Isomorphism

Figure 4:
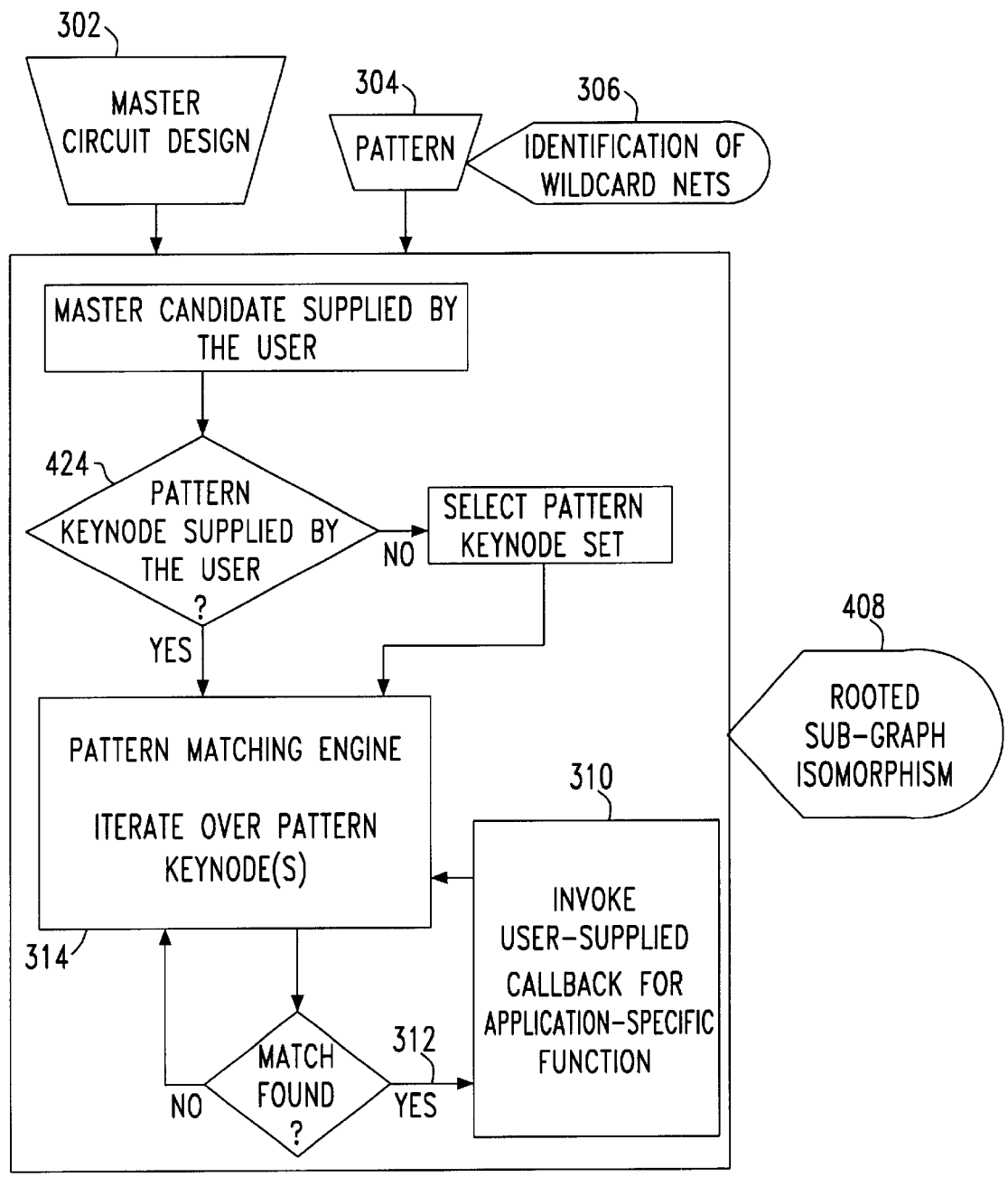
FIG. 4 shows the pattern matcher when used for rooted sub-graph isomorphism, wherein a user queries whether an instance of the pattern is present in a particular location of the main circuit design.

FIG. 4 shows another pattern matching flow in which rooted sub-graph isomorphism 408 allows the user to supply a master net or device and query whether there is an instance of the pattern which contains this master root node. The net comparison function is used to identify one or more pattern keynodes which are potential matches for the user-supplied master candidate. The pattern matching engine starts with the master root and finds all instances of the pattern which include it. The pattern matching engine iterates over each pattern keynode and proceeds as above.

The user may also optionally supply a pattern root 424, modifying the task to that of pattern-matching with the initial match of pattern keynode and master candidate both specified.

If the root is a device, the pattern matcher returns one match if there is a pattern instance which contains this element. In the case of a net, there may be more than one instance of the pattern connected to the given root net. The user-defined callback function 310 is called for each match which is found.

Utilization of the pattern matcher for this specialized query allows efficient processing with the same wildcard net capability as the general pattern matcher. A brute force exhaustive search, though potentially yielding the same results would be computationally significantly more expensive.

Whereas this invention has been described with reference to a single preferred embodiment, those skilled in the art will realize that many modifications and changes can be made, particularly in the steps describing the algorithm, without departing from the scope of the subject matter of the invention.

We claim:

1. A method of matching a pattern sub-circuit in a master circuit design, the master circuit design being both formed by a plurality of master devices interconnected by master nets and modeled as a graph, and the pattern sub-circuit being formed by a plurality of pattern devices interconnected by pattern nets and modeled as a graph, wherein both nets and devices are explicitly modeled as nodes in the graphs, enabling both exact and inexact pattern matching using a single pattern matching engine, the method comprising the steps of:

a) defining an explicit net comparison function that enables both the exact matching and the inexact matching of the pattern net to a master net, where an inexact match is a match to a master net which is connected to a power supply or to a net which is already matched to another pattern net;

b) defining an explicit device comparison function that enables the matching of the pattern device to the master device based on a device characteristic;

c) defining a node comparison function which compares two device nodes using the explicit device comparison function or compares two net nodes using the explicit net comparison function;

d) identifying a pattern keynode;

e) identifying a set of candidate nodes in the master circuit design for which the node comparison function is indicative of a potential match between the pattern keynode and a node in the master circuit design;

f) iterating over a set of master candidate nodes;

g) for each of the master candidate nodes, exploring a potential match of the pattern in the master circuit design containing the candidate node, and h) repeating steps f) and g) until all instances of the pattern in the master circuit design have been identified and invoking a user-supplied function for each of the instances to enable circuit design analysis, verification or optimization prior to its manufacture.

2. The method as recited in claim 1, wherein step g) further comprises the steps of:

g1) matching the pattern node to the master node;

g2) creating symmetry classes of device nodes and symmetry classes of net nodes connected to the nodes matched in step g1), where the symmetry class consists of a set of nodes comprising one pattern node and at least one master node which are potential matches;

g3) identifying the symmetry classes which consist of exactly one pattern node and one master node and matching the pattern node to the master node for each of the identified symmetry classes;

g4) using the node comparison function to identify the symmetry classes of nodes connected to the nodes matched in step g3);

g5) repeating steps g3) and g4) until there are no symmetry classes which consist of exactly one unmatched pattern node and one master node;

g6) selecting one symmetry class from all the symmetry classes which contain an unmatched pattern node;

g7) iterating over members of the symmetry class, exploring the potential match of the pattern node to each of the master nodes in the symmetry class; and g8) for each master node, making a recursive call with the initial match of the pattern node to the master node, and repeating steps g1) through g8) until either all pattern nodes have been matched to master nodes or a mismatch is found, prompting backtracking and unmatching nodes up to the symmetry class iteration in step g7).

3. The method of claim 1, wherein a user specifies which of each of pattern external nets are permitted to be matched inexactly and wherein the remainder of the pattern external nets are matched exactly.

4. The method of claim 3, wherein the inexact match defines matching a master power net to a pattern net or matching a master net to at least two pattern nets, enabling the matching of shorted inputs.

5. The method of claim 1, wherein an application-specific function is invoked for each of the matches identified, and wherein the application-specific function refers to pattern devices and pattern nets to access the matching master devices and nets.

6. The method of claim 5, wherein the application-specific function is supplied by a user.

7. The method of claim 1, wherein sub-circuits in a device-level design are identified to perform timing analysis and optimization of device-level circuits.

8. The method of claim 1, wherein sub-circuits in a device-level design are identified to perform noise analysis and optimization of device-level circuits.

9. The method of claim 1, wherein sub-circuits in a device-level design are identified to perform electrical rules analysis prior to manufacturing device-level circuits.

10. The method of claim 1, wherein sub-circuits in a device-level design are identified to perform design verification prior to manufacturing device-level circuits.

11. The method of claim 1, wherein sub-circuits in a device-level design are identified to perform test pattern generation for testing device-level circuits.

12. The method of claim 1, wherein sub-circuits in a device-level design are identified to perform a second device-level design analysis to achieve a device-level design optimization.

13. The method of claim 1, wherein the device is selected from a group consisting of transistors, bipolar devices and four-terminal devices.

14. A method of matching a pattern sub-circuit in a master circuit design, the master circuit design being both formed by a plurality of master devices interconnected by master nets and modeled as a graph, and the pattern sub-circuit being formed by a plurality of pattern devices interconnected by pattern nets and modeled as a graph, wherein both nets and devices are explicitly modeled as nodes in the graphs, enabling rooted sub-graph isomorphism and enabling both exact and inexact pattern matching using a single pattern matching engine, the method comprising the steps of:

a) defining an explicit net comparison function that enables both the exact matching and the inexact matching of the pattern net to a master net, where an inexact match is a match to a master net which is connected to a power supply or to a net which is already matched to another pattern net;

b) defining an explicit device comparison function that enables the exact matching of the pattern device to the master device based on a device characteristic;

c) defining a node comparison function which compares two device nodes using the explicit device comparison function or compares two net nodes using the explicit net comparison function;

d) inputting of a master candidate;

e) identifying a set of pattern keynodes in the pattern sub-circuit for which the node comparison function is indicative of a potential match between the master candidate and a node in the pattern sub-circuit;

f) iterating over the set of pattern keynodes;

g) for each of the pattern keynodes, exploring a potential match of the pattern in the master circuit design containing the master candidate; and h) repeating steps f) and g) until all instances of the pattern in the master circuit design which contain the master candidate have been identified and invoking a user-supplied function for each of the instances to enable circuit design analysis, verification or optimization prior to its manufacture.

15. The method as recited in claim 14, wherein step g) further comprises the steps of:

g1) matching the pattern node to the master node;

g2) creating symmetry classes of device nodes and symmetry classes of net nodes connected to the nodes matched in step g1), where the symmetry class consists of a set of nodes comprising one pattern node and at least one master node which are potential matches;

g3) identifying the symmetry classes which consist of exactly one pattern node and one master node and matching the pattern node to the master node for each of the identified symmetry classes;

g4) using the node comparison function to identify the symmetry classes of nodes connected to the nodes matched in step g3);

g5) repeating steps g3) and g4) until there are no symmetry classes which consist of exactly one unmatched pattern node and one master node;

g6) selecting one symmetry class from all the symmetry classes which contain an unmatched pattern node;

g7) iterating over members of the symmetry class, exploring the potential match of the pattern node to each of the master nodes in the symmetry class; and g8) for each master node, making a recursive call with the initial match of the pattern node to the master node, and repeating steps g1) through g8) until either all pattern nodes have been matched to master nodes or a mismatch is found, prompting backtracking and unmatching nodes up to the symmetry class iteration in step g7).

16. The method of claim 14, wherein a user supplies the set of pattern keynodes, and wherein the pattern matching engine determines whether the pattern can be imbedded at a particular location in the master circuit design, with an initial match of a pattern node to a master node specified by the user.

17. A program storage device readable by machine, tangibly embodying a program of instructions executable by the machine to perform method steps for matching a pattern sub-circuit in a master circuit design, the master circuit design being both formed by a plurality of master devices interconnected by master nets and modeled as a graph, and the pattern sub-circuit being formed by a plurality of pattern devices interconnected by pattern nets and modeled as a graph, wherein both nets and devices are explicitly modeled as nodes in the graphs, enabling both exact and inexact pattern matching using a single pattern matching engine, the method comprising the steps of:

a) defining an explicit net comparison function that enables both the exact matching and the inexact matching of the pattern net to a master net which is connected to a power supply or to a net which is already matched to another pattern net;

b) defining an explicit device comparison function that enables the exact matching of the pattern device to the master device based on a device characteristic;

c) defining a node comparison function which compares two device nodes using the explicit device comparison function or compares two net nodes using the explicit net comparison function;

d) identifying a pattern keynode;

e) identifying a set of candidate nodes in the master circuit design for which the node comparison function is indicative of a potential match between the pattern keynode and a node in the master circuit design;

f) iterating over a set of master candidate nodes;

g) for each of the master candidate nodes, exploring a potential match of the pattern in the master circuit design containing the candidate node, and h) repeating steps f) and g) until all instances of the pattern in the master circuit design have been identified and invoking a user-supplied function for each of the instances to enable circuit design analysis, verification or optimization prior to its manufacture.

* * * * *